(12) United States Patent
Dooper et al.

(10) Patent No.: US 8,378,745 B2
(45) Date of Patent: Feb. 19, 2013

(54) CURRENT SENSING

(75) Inventors: Lutsen Ludgerus Albertus Hendrikus Dooper, Brummen (NL); Gerrit Dijkstra, Renkum (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/835,765

(22) Filed: Jul. 14, 2010

(65) Prior Publication Data

US 2011/0012677 A1 Jan. 20, 2011

(30) Foreign Application Priority Data

Jul. 15, 2009 (EP) .................................. 09251801

(51) Int. Cl.
*H03F 3/217* (2006.01)
(52) U.S. Cl. ..................................... 330/251; 330/207 A
(58) Field of Classification Search .................... 330/10, 330/207 A, 251
See application file for complete search history.

(56) References Cited

U.S. PATENT DOCUMENTS

| | | | |
|---|---|---|---|
| 7,705,673 B2 * | 4/2010 | Teng et al. .................. 330/207 P |
| 7,994,857 B2 * | 8/2011 | Albers et al. .................. 330/251 |
| 2009/0115510 A1* | 5/2009 | Tamisier ......................... 330/10 |
| 2009/0169022 A1 | 7/2009 | Kost |

FOREIGN PATENT DOCUMENTS

EP 1739318 A1 1/2007

OTHER PUBLICATIONS

Muggier, P. et al. "A Filter Free Class D Audio Amplifier With 86% Power Efficiency" Proc. Int. Symp. Circuits and Systems, vol. 1, pp. 1-1036 to 1-1039 (May 2004).
Data Sheet No. PD60234 revB, IR22771S/IR21771S(PbF)—Phase Current Sensor IC for AC Motor Control, International Rectifier, 32 pgs. (Aug. 2005).
Chen, J. et al. "Integrated Class D Amplfier with Active Current Sensing Suitable for Alternating Current Switches", IEEE Trans. On Industrial Electronics, vol. 55, No. 8, pp. 3141-3149 (Aug. 2008).

* cited by examiner

*Primary Examiner* — Henry Choe

(57) ABSTRACT

A switching amplifier comprising: an output driving circuit (400) including a pair of switching transistors (M1, M2) connected in series between a pair of supply voltage lines ($V_P$, gnd); a switch driver circuit (204a) configured to drive the switching transistors (M1, M2) with first and second respective PWM signals dependent on an input signal (101); an output connection between the pair of transistors (M1, M2) for driving an output load (403); and an output current sensing circuit for measuring a current through the output load, the output current sensing circuit comprising: a current sensing resistor (401a) connected between a first one (M2) of the pair of transistors and an adjacent supply voltage line (gnd); and a voltage sense circuit (404) connected across the current sensing resistor, wherein the voltage sense circuit is configured to sample a voltage across the current sensing resistor (401a) at a midpoint of successive corresponding portions of one of the PWM signals.

12 Claims, 10 Drawing Sheets

CURRENT SENSING

This application claims the priority under 35 U.S.C. §119 of European patent application no. 09251801.8, filed on Jul. 15, 2009, the contents of which are incorporated by reference herein.

FIELD OF INVENTION

The invention relates to current sensing in switching audio amplifiers, and in particular to a method and system for measuring an output current in such amplifiers.

BACKGROUND OF INVENTION

There are several categories of audio amplifiers, including class A, class AB, class C, class D etc. Class D amplifiers operate by means of output transistors acting as switches. When a transistor is off, the current through the transistor is effectively zero. When a transistor is on, the voltage across the transistor is small, ideally zero. In each case, the power dissipation is very low. This increases the efficiency, thus requiring less power from the power supply and smaller heat sinks for the amplifier. These are important advantages, particularly for portable battery-powered equipment.

A class-D audio amplifier typically uses two power transistors. One transistor switches the output to a positive voltage supply and the second transistor switches the output to a negative voltage supply. Some steering logic prevents a short circuit from being made by one transistor being switched on while the other transistor is still on. A square wave signal produced at an output of the amplifier as a result of this switching has a frequency of typically 350 kHz, i.e. considerably higher than the frequency range of an audio signal. The output amplitude of the amplifier can be modulated by altering the pulse width of the output signal. With a passive filter (usually LC-filter) the Pulse Width Modulated (PWM) output signal is filtered to remove high frequency components of the output signal cause by the switching operations. The amplified audio signal can therefore be used for driving a loudspeaker. FIG. 1 shows a typical straightforward solution for class D amplification, in which an input analog signal 101 is compared by a comparator 103 with a reference signal 102 having a triangular waveform. The comparator 103 provides an output that switches between two output values when the input signal 101 crosses the triangular waveform signal 102, resulting in an output signal 105 having a pulse width modulation that is dependent on the magnitude of the input signal 101. The output signal 105 from the comparator 103 is provided to a switch driver 104, which provides corresponding switching signals to a pair of power transistors M1, M2, switching transistor M1 on and transistor M2 off when the output signal 105 is high, and transistor M1 off and transistor M2 on when the output signal 105 is low. The transistors M1, M2 are connected in series between a pair of voltage supply lines, in this case between a positive supply line at Vp and a negative supply line at $V_N$. An output connection 106 between the transistors M1, M2 therefore varies between $V_P$ and $V_N$ (discounting any voltage drop across the transistors), resulting in a voltage output signal 107 having the form of the pulse width modulation signal 105. A combined resistive and inductive load, in this case a conventional magnet-coil loudspeaker 108, is connected between the output connection 106 and ground 109.

Other types of switching amplifiers are also known, including types where the PWM signal is generated in the digital domain.

An LC circuit comprising inductor 110 and capacitor 111 provide a filter to suppress the high frequency switching components of the output signal from the switching amplifier. The current 112 passing through the loudspeaker 108 is then an accurate amplified representation of the original input signal 101.

Such class D amplifiers can be designed to be highly efficient, a feature that is particularly advantageous in portable applications, where typical loudspeaker output powers may be up to around 3 W. A variation on the above amplifier is illustrated in FIG. 2, in which the amplifier incorporates a second pair of power switching transistors M1' M2'. The first pair of transistors M1, M2 are driven by a first switching circuit 204a as before by a signal dependent on the input signal 101 compared with a triangular waveform 102, in this case switching a first output connection 206a between the positive supply voltage $V_P$ and ground. The second pair of transistors M1', M2' are driven by a second switching signal 204b with a signal that is dependent on an inverted version of the input signal 101 compared with the same triangular waveform 102, and provides a voltage on a second connection 206b between the positive supply voltage $V_P$ and ground. This type of switching amplifier, at least when driving a partially inductive load such as a magnet-coil loudspeaker, does not require additional filtering components. The required PWM switching pattern for such filterless operation is illustrated in reference [1] below.

The maximum Sound Pressure Level (SPL) of a speaker connected to a class D amplifier in portable applications is mostly limited by the mechanical construction of the speaker. Particularly at low audio frequencies (<600 Hz) the speaker maximum input power is limited. For safety reasons, a high pass filter is typically added in the audio path. However, for short moments the speaker may be subjected to significantly more power than its rating. An algorithm that allows for the maximum speaker output power to be obtained under all conditions is described in reference [3] below. This algorithm reduces or increases the gain at certain frequencies dependent on the condition of the speaker. The algorithm requires as an input a measure of the current running through the speaker, which therefore needs to be sensed at the output of the class D amplifier.

Accurately measuring the current flowing through the speaker is however not a trivial operation, due to the switched nature of the output signal. Other requirements may also need to be met for current sensing, such as the speaker current being digitized, i.e. converted into a digital signal. Two important requirements are that the current should be measured accurately enough as well at a sufficient resolution for a current limiting algorithm to work effectively. A 12 bit ADC is typical for such applications, although other resolutions would also be possible, depending on the application and the particular algorithm used to process the digital current signal.

OBJECT OF INVENTION

It is an object of the invention to address the above issues and provide an accurate method of output current sensing for class D amplifiers.

SUMMARY OF INVENTION

According to a first aspect of the invention there is provided a switching amplifier comprising:
  an output driving circuit including a pair of switching transistors connected in series between a pair of supply voltage lines;

a switch driver circuit configured to drive the switching transistors with first and second respective PWM signals dependent on an input signal;

an output connection between the pair of transistors for driving an output load; and an output current sensing circuit for measuring a current through the output load, the output current sensing circuit comprising:

a current sensing resistor connected between a first one of the pair of transistors and an adjacent supply voltage line; and a voltage sense circuit connected across the current sensing resistor, wherein the voltage sense circuit is configured to sample a voltage across the current sensing resistor at a midpoint of successive corresponding portions of one of the PWM signals.

The output load preferably comprises at least an inductive component, and is for example in the form of a magnet-coil based loudspeaker, providing a combined resistive and inductive load.

The input signal to the switch driver circuit may be an analog signal, as in the switching amplifiers described above, or may be a digital signal from which the PWM signals are derived.

The voltage sense circuit may comprise a PWM counter module and a track and hold circuit, the PWM counter module being configured to count a number of clock cycles of a positive portion of the first PWM signal and to trigger the track and hold circuit to sample the voltage across the current sensing resistor at the midpoint of a subsequent negative portion of the second PWM signal based on a subtraction of the number of clock cycles over a PWM period and the number of clock cycles of a positive portion of the first PWM signal.

The PWM counter module may comprise:

a first counter configured to reset at each rising edge of the first PWM signal and to count the number of clock cycles of the positive portion of the first PWM signal;

a subtractor module configured to subtract the number of clock cycles counted by the first counter from the number of clock cycles over the PWM period; and a second counter configured to reset on each falling edge of the first PWM signal and count for half of a calculated number of clock cycles in a subsequent negative portion of the second PWM signal, the second counter configured to provide a clock signal to the track and hold circuit to sample the voltage across the sensing resistor when half the number of clock cycles in the subsequent negative portion of the second PWM signal are counted.

The PWM counter module may comprise a multiplier module configured to receive the number of clock cycles of the negative portion of the second PWM signal from the subtraction module and provide half the number of clock cycles in the negative portion of the second PWM signal to the second counter.

The second counter may be configured to count the number of clock cycles in the subsequent negative portion of the second PWM signal at twice the rate of the first counter.

The output driving circuit may comprise a first pair and a second pair of switching transistors, each pair of switching transistors connected in series between the pair of supply voltage lines.

The pair of voltage lines may be a voltage supply line and a ground line, the current sensing resistor connected between a first one of the first pair of switching transistors and the ground line.

The first one of each pair of switching transistors is preferably an N-MOS transistor. An advantage of sensing the current between N-MOS transistors and ground is that only low voltages are applied to the voltage sensing circuit.

The amplifier may comprise a second current sensing resistor connected between a first one of the second pair of switching transistors and the ground line.

The voltage sense circuit may be configured to sample a differential voltage across the first and second current sensing resistors.

According to a second aspect of the invention, there is provided a method of sensing output current from a switching audio amplifier comprising an output driving circuit including a pair of switching transistors connected in series between a pair of supply voltage lines, the pair of switching transistors being driven by a switch driver circuit with first and second respective PWM signals dependent on an input signal, the method comprising triggering a track and hold circuit to sample a voltage across a current sensing resistor connected between a first one of the pair of transistors and an adjacent supply voltage line at a midpoint of the subsequent negative portion of the second PWM signal.

The method may comprise:

counting a number of clock cycles of a positive portion of the first PWM signal;

calculating a number of clock cycles in the subsequent negative portion of the second PWM signal by subtracting the number of clock cycles of the positive portion from a number of clock cycles in a period of the PWM signals; and calculating the midpoint of the subsequent negative portion of the second PWM signal by halving the calculated number of clock cycles in the negative portion of the second PWM signal.

BRIEF DESCRIPTION OF DRAWINGS

Embodiments of the invention are described by way of example below, with reference is made to the appended drawings, in which.

SPECIFIC DESCRIPTION OF THE EMBODIMENTS

Figure 1:
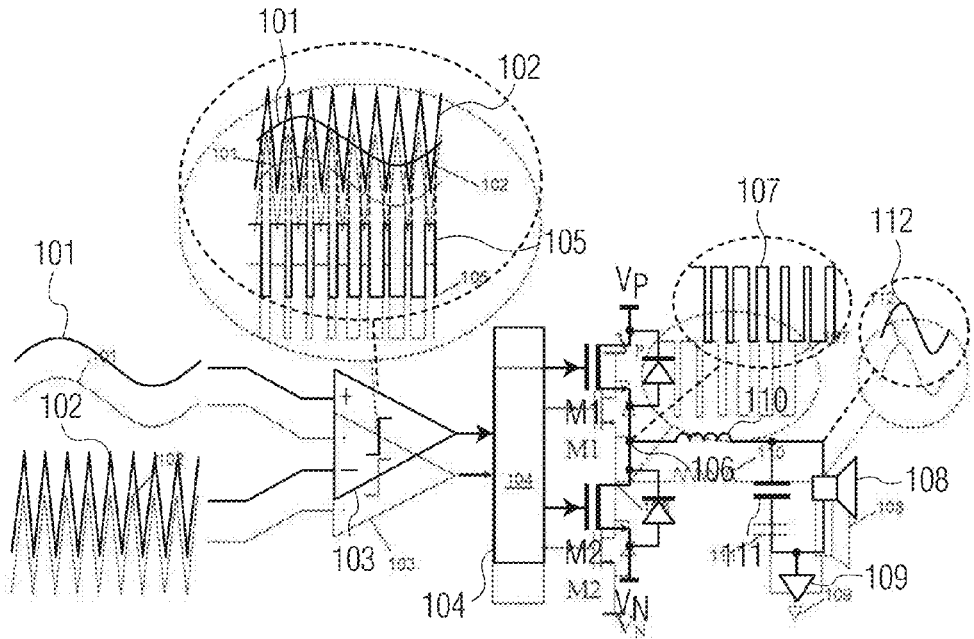
FIG. 1 is a schematic circuit diagram of a class D audio amplifier having a single-ended configuration.
Figure 2:
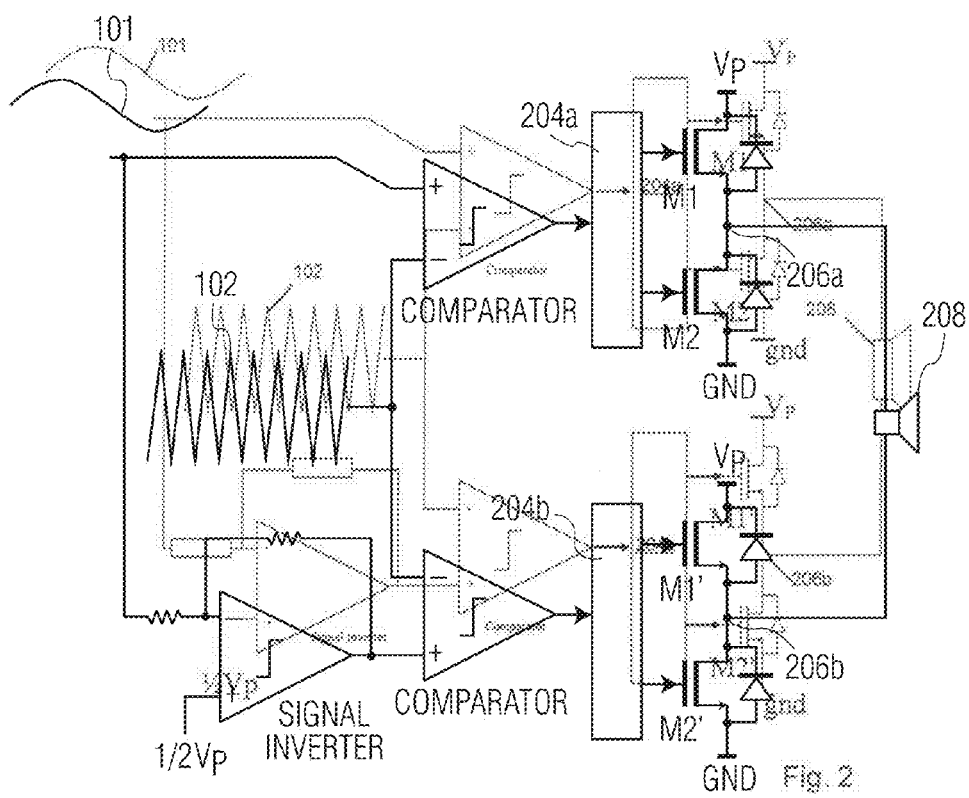
FIG. 2 is a schematic circuit diagram of a filterless class D audio amplifier having a bridge tied load configuration.

FIGS. 1 and 2 have been discussed above in relation to the background to the invention.

Figure 3:
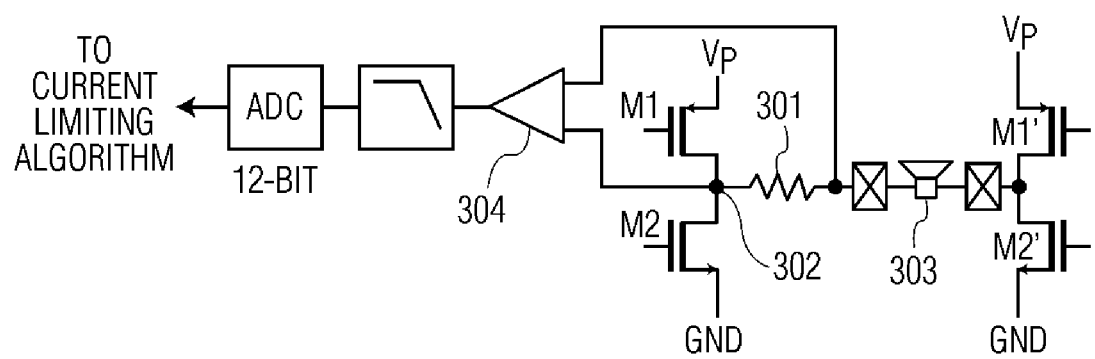
FIG. 3 is a schematic circuit diagram of a known current sensing method.

A simple method to sense a speaker current, illustrated by the output driving portion of a switching amplifier shown in FIG. 3, is to place a series resistance 301 between an output 302 of a switching amplifier and the loudspeaker 303 to be driven. Measuring the voltage across this sense resistance 301 allows the actual current through the speaker 303 to be determined. The sense resistor 301 should be as small as possible to minimize the voltage loss over this resistor. The voltage loss reduces the maximum output power of the speaker 303. The sense resistance 301 cannot however be too small because the measured voltage across it needs to meet the various requirements for sensing current, such as the aforementioned SNR requirement.

In the circuit shown in FIG. 3, a voltage sense circuit 304 is connected across the sense resistance 301. With the current sensing method shown in FIG. 3, a common mode voltage at the voltage sense circuit inputs switches from gnd to Vp in line with the PWM signal applied at the output 302. The voltage sense circuit 304 therefore needs to suppress this large AC common mode voltage in order to fulfill the requirements of current sensing. This requirement is difficult to realize. This large voltage common mode swing is therefore a disadvantage of this method of current sensing. Another disadvantage of the method is that the power loss in the sense resistor 301 is significant. This can be compensated by decreasing of the on resistance of the power switches, but at the cost of increased chip area. With the circuit shown in FIG. 3 both the N-MOS transistors M2, M2' and the P-MOS transistors M1, M1' would need to be increased in size to do this. For reasons relating to how the transistors are fabricated, P-MOS transistors M1, M1' would require an additional increase in chip area compared with the increase required for the N-MOS transistors M2, M2'.

A further method of current sensing is described in reference [2] below, in which current is measured by copying the current in the power switches. This method also has disadvantages, in that the arrangement is complex and current has to be sensed in both upper and lower power switches.

Figure 4:
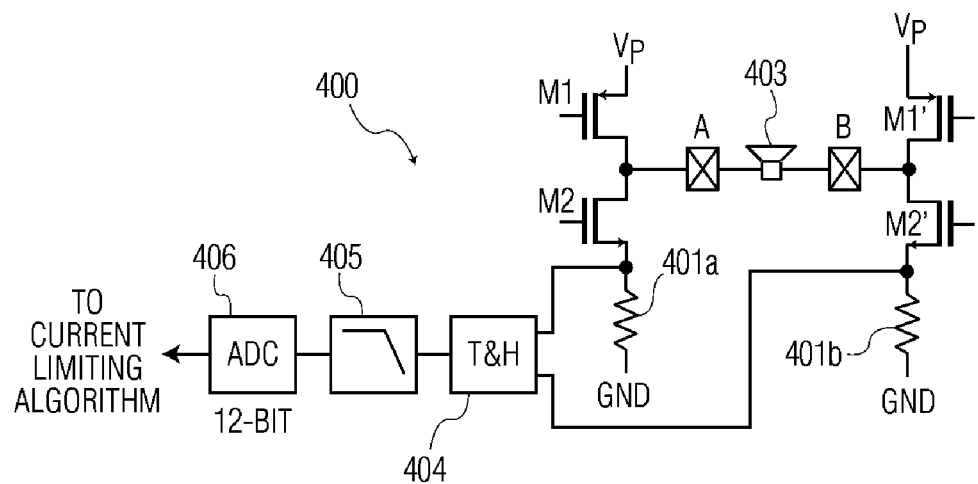
FIG. 4 is a schematic circuit diagram of a first embodiment of a current sensing circuit connected to the output stage of a class D amplifier.

An embodiment of an output stage of a switching amplifier 400 according to the invention, incorporating a current sensing circuit, is illustrated in FIG. 4. In this embodiment, current sensing resistors 401a, 401b are connected between each N-MOS transistor M2, M2' and ground. A voltage sense circuit 404, described in more detail below, detects the voltage across each resistor 401a, 401b, and passes an output signal, via a low pass filter 405, to a 12-bit ADC 406. As outlined above in relation to the background to the invention, other resolutions of ADC may be used, depending on the application and the algorithm used for processing the digital current signal. The output digital signal from the ADC 406 is provided to a module on which an current limiting algorithm is run, which limits the maximum current applied to the loudspeaker 403.

Figure 5:
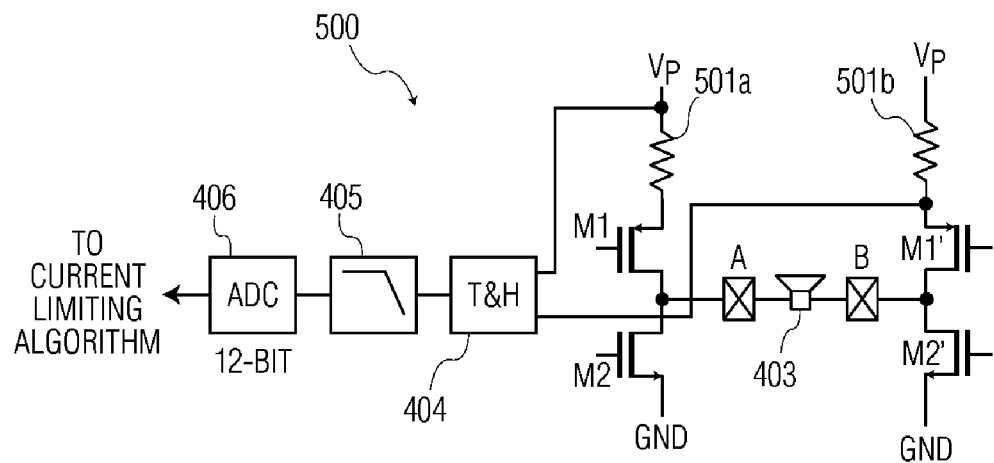
FIG. 5 is a schematic circuit diagram of a second embodiment of a current sensing circuit connected to the output stage of a class D amplifier.

An alternative embodiment of an output stage of a switching amplifier 500 according to the invention is illustrated in FIG. 5. In this embodiment, current sensing resistors 501a, 501b are connected between each P-MOS transistor M1, M1' and the positive voltage supply $V_P$. Operation of the voltage sensing circuit 404, low pass filter 405 and ADC 406 are otherwise the same as in the embodiment of FIG. 4.

In both of the above described embodiments, the presence of the current sensing resistors 401a, 401b, 501a, 501b can be compensated by adjusting the output resistances of the transistors to which they are connected. In the embodiment of FIG. 4, the N-MOS transistors M2, M2' can be made larger, while in the embodiment in FIG. 5 the P-MOS transistors M1, M1' can be made larger. For reasons relating to how the transistors are fabricated, the additional area taken up by the P-MOS transistors would need to be larger than that taken up by the N-MOS transistors when doing this. The embodiment in FIG. 4 is therefore preferred. Furthermore, in the embodiment of FIG. 4 the voltage sensing circuit 404 senses voltages close to ground, whereas the voltage sensing circuit 404 in the embodiment of FIG. 5 senses voltages close to V. The voltage sensing circuit 404 in the FIG. 4 embodiment does not therefore need high voltage devices.

A feature of either of the above described embodiments of the invention is that the speaker current is sampled by the voltage sensing circuit 404 when current is flowing through only the N-MOS transistors (FIG. 4) or through only the P-MOS transistors (FIG. 5).

Figure 6:
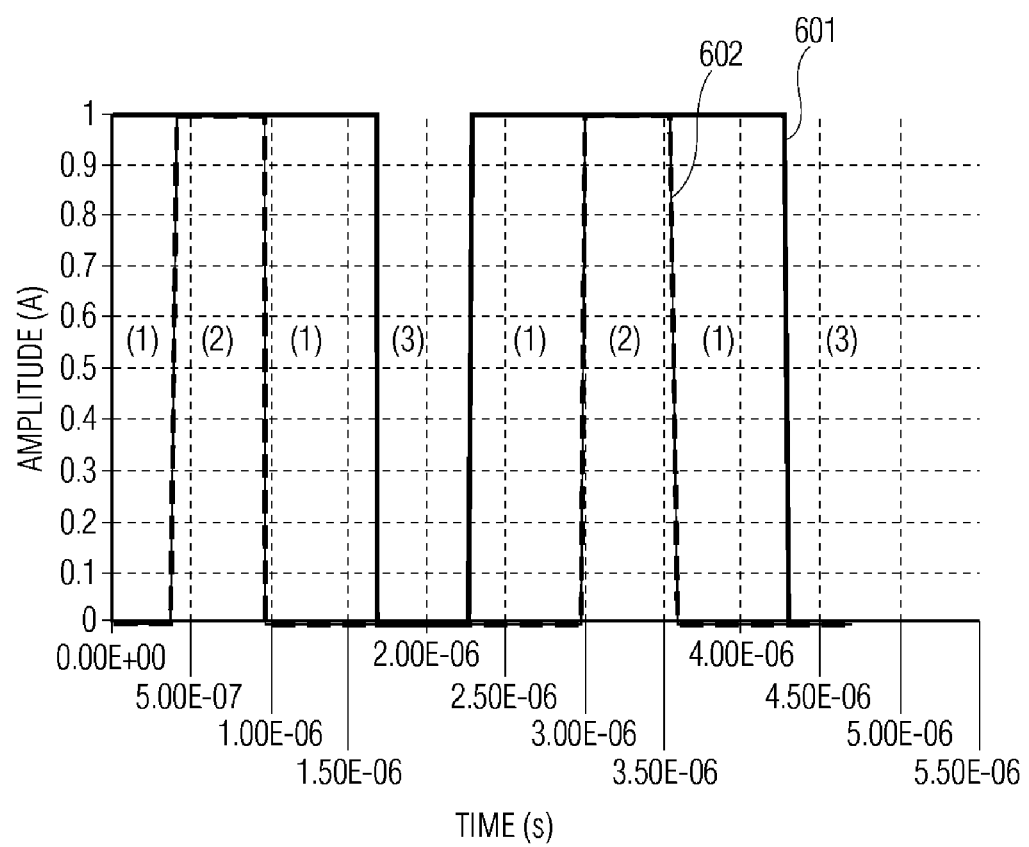
FIG. 6 is a graph illustrating first and second PWM signals.

The graph in FIG. 6 illustrates exemplary PWM signals used for driving a switching amplifier, the signals comprising a first PWM signal 601, hereinafter termed PWMA, and a second PWM signal 602, hereinafter termed PWMB. Three regions are denoted in FIG. 6. In region 1, PWMA=1, PWMB=0, corresponding to positive differential switching in an H-bridge output as shown in FIGS. 4 and 5. In region 2, PWMA=1 and PWMB=1, corresponding to a common switching of the amplifier output to the power supply $V_P$. In region 3, PWMA=0 and PWMB=0, corresponding to a common switching of the amplifier output to ground. A further mode, in which PWMA=0 and PWMB=1 is not shown in FIG. 6, but corresponds to a negative differential switching mode.

Figure 7A:
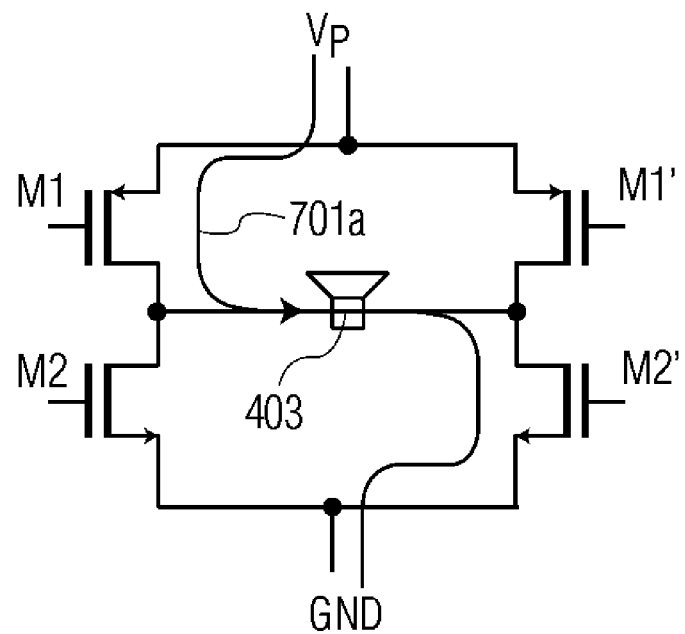
FIGS. 7a and 7b illustrate the current flow through an output loudspeaker for positive and negative differential switching portions of a switching cycle.
Figure 7B:
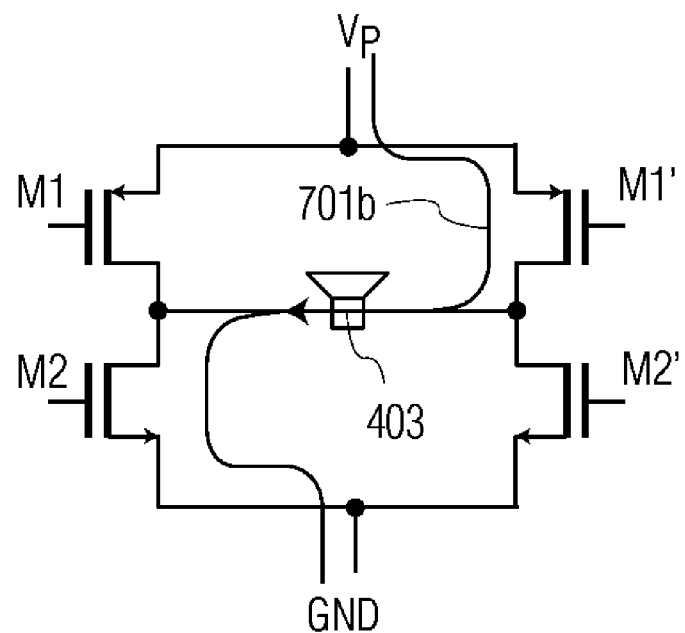
Figure 8A:
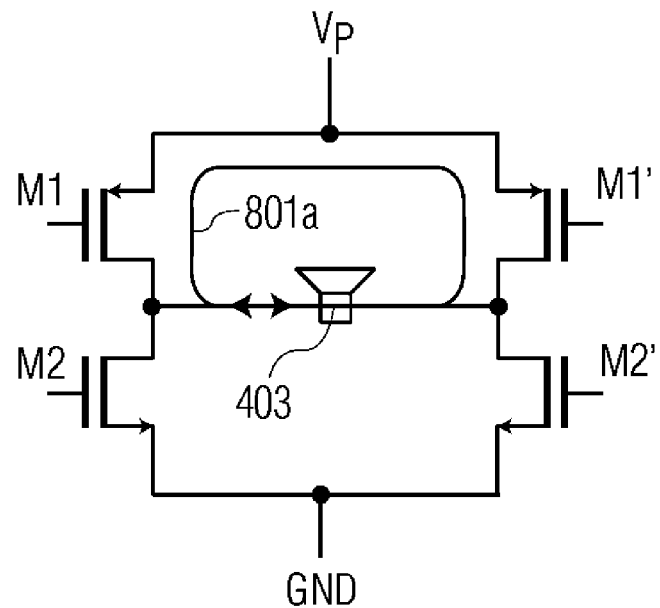
FIGS. 8a and 8b illustrate the current flow through the output loudspeaker for portions of a PWM switching cycle in which there is common switching to the power supply and to ground respectively.
Figure 8B:
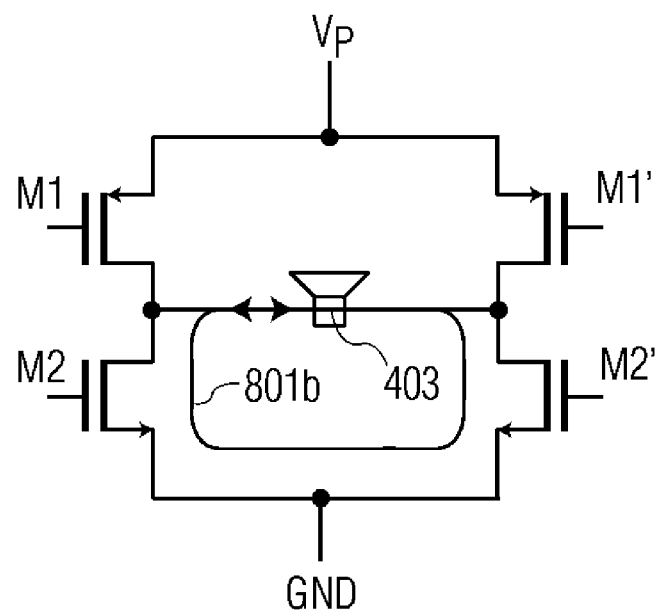

The current flows through a loudspeaker connected across the output terminals of a switching amplifier for each of the four possible switching modes are illustrated in FIGS. 7a and 7b for the positive and negative differential switching modes, and in FIGS. 8a and 8b for the common switching modes.

In FIG. 7a, the current flow 701a is shown during a positive differential switching mode, i.e. when PWMA=1 and PWMB=0. In this mode, transistors M1 and M2' are open and transistors M1' and M2 are closed. Current flows from left to right through the loudspeaker 403 connected between the two output terminals of the amplifier.

In FIG. 7b, the current flow 701b is shown during a negative differential switching mode, i.e. when PWMA=0 and PWMB=1. In this mode, transistors M1' and M2 are open and transistors M1 and M2' are closed. Current flows from right to left through the loudspeaker 403 connected between the two output terminals of the amplifier.

In FIG. 8a, the current flow 801a is shown during a common switching mode to the power supply $V_P$, when PWMA=1 and PWMB=1. In this mode, transistors M1 and M1' are closed and transistors M2 and M2' are open. Current flows in either direction through the loudspeaker 403, depending on the immediately preceding differential switching mode.

In FIG. 8b, the current flow 801b is shown during a common switching mode to ground, when PWMA=0 and PWMB=0. In this mode, transistors M1 and M1' are open and transistors M2 and M2' are closed. Current flows in either direction through the loudspeaker 403, depending on the direction of current flow in the immediately preceding differential switching mode.

Figure 9:
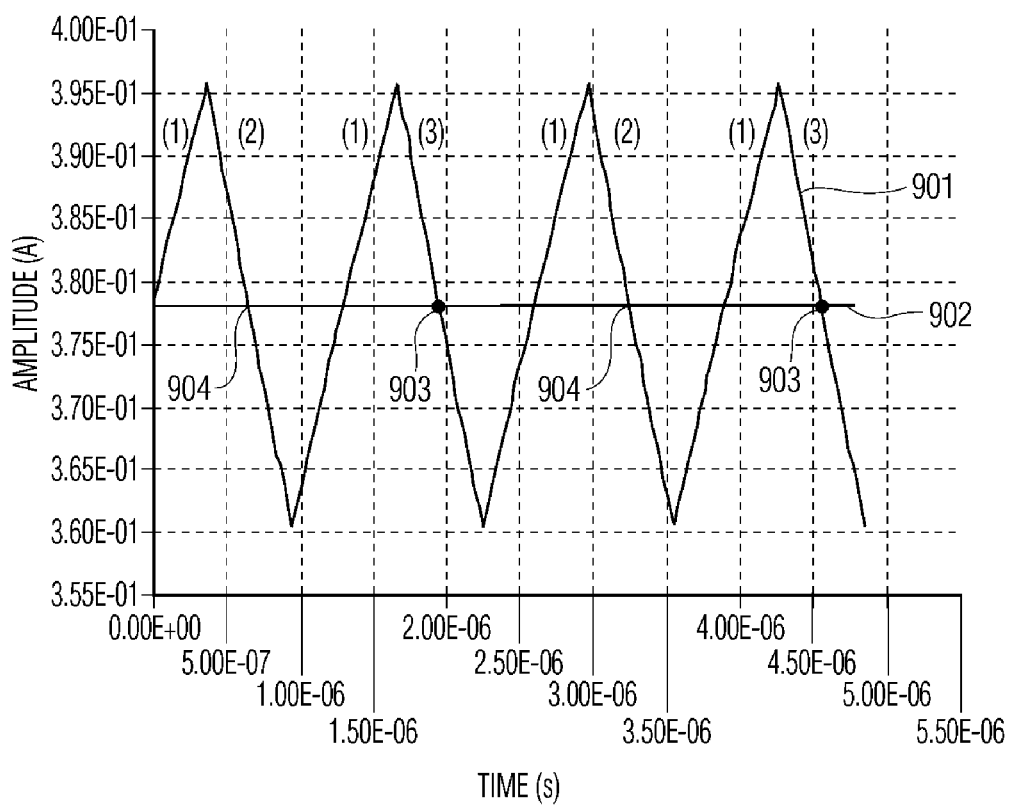
FIG. 9 illustrates the triangular waveform of current through a loudspeaker load over a switching cycle.

The actual current 901 flowing through the output loudspeaker 403 over an exemplary PWM cycle is shown in FIG. 9. The different regions 1-3 shown in FIG. 6 correspond with regions 1-3 shown in FIG. 9. Because the loudspeaker presents an inductive and resistive load, the current has a triangular form. In positive differential switching regions (1), the current is rising. In regions (2) & (3), where there is common switching to either the power supply or to ground, respectively, the current is falling. An average current 902, which is representative of the actual power transferred to the loudspeaker, is given by the DC offset indicated by the triangular waveform of the current 901.

The ideal moments to sample the current 901 is therefore when the current 901 is equal to this average current 902 and is flowing through both current sampling resistors. These points 903, 904 are indicated on FIG. 9, and lie within the periods where there is common switching to ground (shown in FIG. 8*b*) or common switching to the power supply (shown in FIG. 8*a*), respectively. At points 903, the sampled current is flowing through both N-MOS transistors.

Because the shape of the current waveform 901 is (at least approximately) triangular, the ideal sampling moments 903 are in the middle of the common to ground switching period. These moments can therefore be calculated using a counter, which causes a sample and hold circuit to sample the voltage signal across each sampling resistor at the correct moment. There are various advantages of this method, including:

No large common mode voltage swing over the sense resistors;

No level shifting being required, because the sensed voltage levels are around ground level, not at Vp level (when the resistors are connected to the N-MOS transistors);

Only the N-MOS transistors (or the P-MOS transistors in certain embodiments) have to be made larger to compensate for the power loss of the sense resistors; and By sampling at the middle of the common switching to ground (or to the power supply), the average voltage is obtained, so no extra filtering is required.

The method of sampling requires that the load has some inductance, but this is always the case if a magnet-coil based loudspeaker is used.

Figure 10:
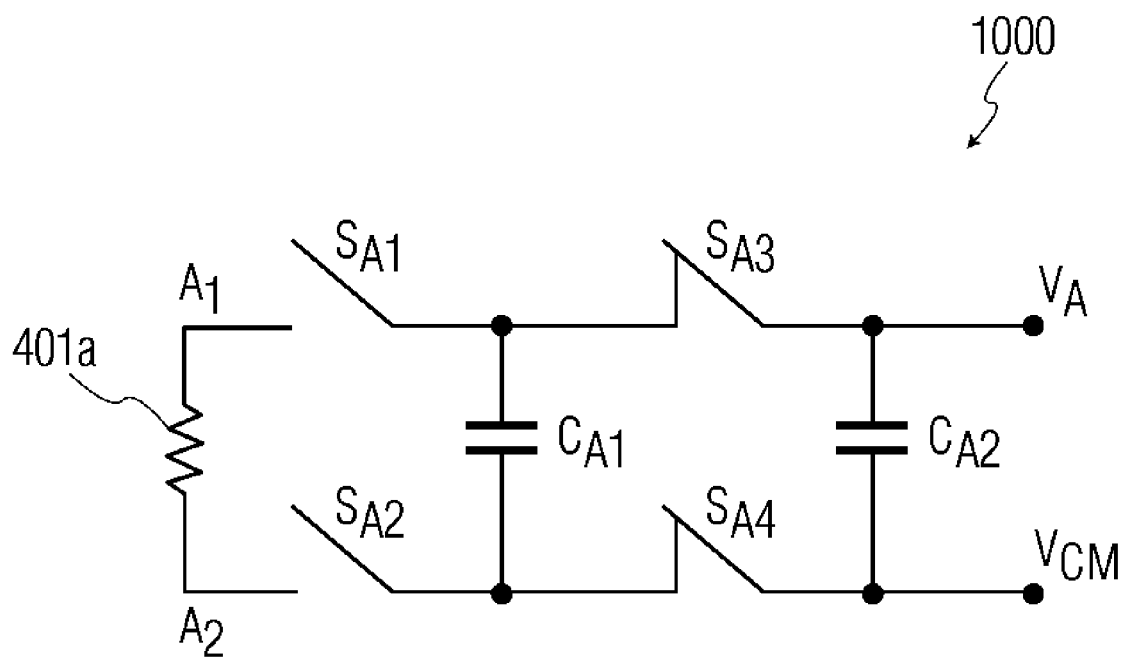
FIG. 10 is a schematic circuit diagram of a track and hold circuit.

An exemplary embodiment of the voltage sensing circuit 404 (FIGS. 5 & 6) comprises two parts, being a track and hold circuit for sensing a voltage signal from the sense resistor, and a PWM counter for triggering the track and hold circuit at the correct moments. An exemplary track and hold circuit 1000 is illustrated in FIG. 10, and an exemplary PWM counter is illustrated in block form in FIG. 11.

The Track & Hold circuit is typically implemented twice, once for each sense resistor in the output stage of a H-bridge amplifier. One of these circuits, connected to the sense resistor 401*a* (FIG. 5) is shown in FIG. 10. The track and hold circuit 1000 is operated in two stages, a first stage in which switches $S_{A1}$, $S_{A2}$ are closed and switches $S_{A3}$, $S_{A4}$ are open. In the first stage, a first capacitor $C_{A1}$ is connected across the sampling resistor 401*a* and the first capacitor $C_{A1}$ tracks the voltage across the resistor 401*a*. At the moment of sampling, switches $S_{A1}$, $S_{A2}$ open and switches $S_{A3}$, $S_{A4}$ simultaneously close. The charge from the first capacitor $C_{A1}$ passes to a second capacitor CA2, and a voltage is sampled between $V_A$ and the common mode voltage $V_{CM}$ (which in this case is ground). For the other track and hold circuit, when $W_{CM}$ is ground, the sampled voltage VB will be of opposite sign to the voltage $V_A$.

The voltage signal on $C_{A2}$ is refreshed each time during the transition between sampling and holding. The capacitance value of $C_{A1}$ is preferably larger than that of $C_{A2}$, for example with a ratio between $C_{A1}$, $C_{A2}$ being at least 10:1 ($C_{A1}$ is the larger value).

As shown in FIGS. 4 and 5, the outputs of both T&H circuits are connected to an ADC. Since $V_B$ is the opposite value of $V_A$, the current can be measured differentially. It is also possible to sense only via one resistor, for example when implementing a single-ended switching amplifier. The signal is however then more sensitive to disturbances.

Figure 11:
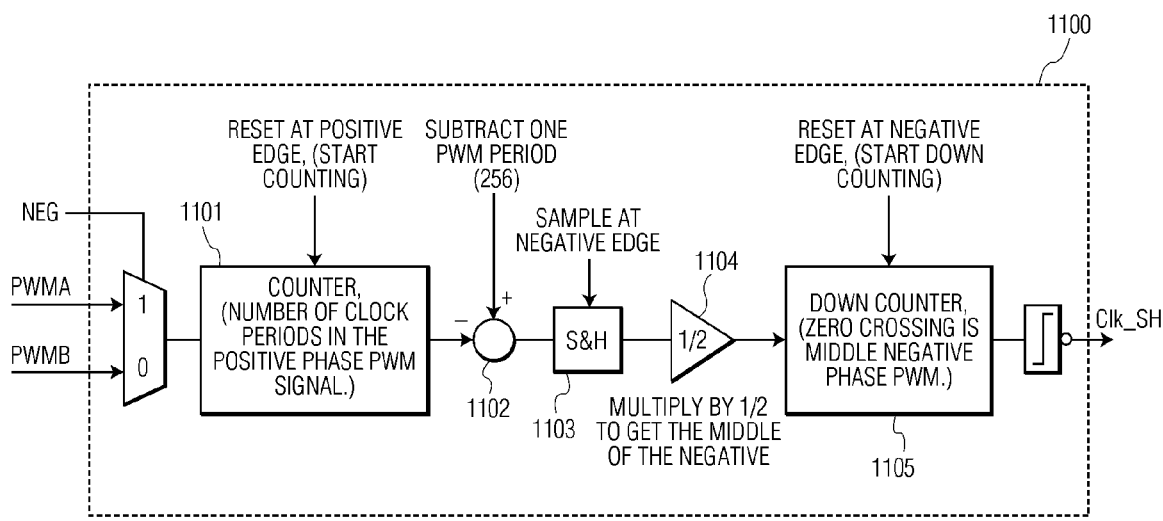
FIG. 11 is a schematic block diagram of a PWM counter module.

A clock required to control switches $S_{A1}$, $S_{A2}$, $S_{A3}$, $S_{A4}$ in the track and hold circuit 1000 can be generated in the digital domain. The two PWM patterns PWMA, PWMB, can be used as an input to drive a PWM counter 1100 for triggering the track and hold circuit, as shown in FIG. 11. The PWM counter 1100 is configured to calculate the mid-point of a period in the PWM cycle when there is common switching to ground (or, in an alternative embodiment, common switching to the power supply $V_P$). The mid-point can be calculated by prediction. First, the length of a positive phase of one of the PWM signals is counted and this value is subtracted from the known fixed PWM period length. In the example shown in FIG. 11, this PWM period length is represented by 256 clock cycles. Subtracting the length of the positive phase from the PWM period length results in the length of the subsequent negative phase of the PWM signal. The midpoint of the negative phase is determined by counting down from the calculated value a factor of two faster than for counting up during the positive phase. When the counter reaches zero, the track and hold circuit is triggered to sample the voltage across the sampling resistor(s).

Figure 12:
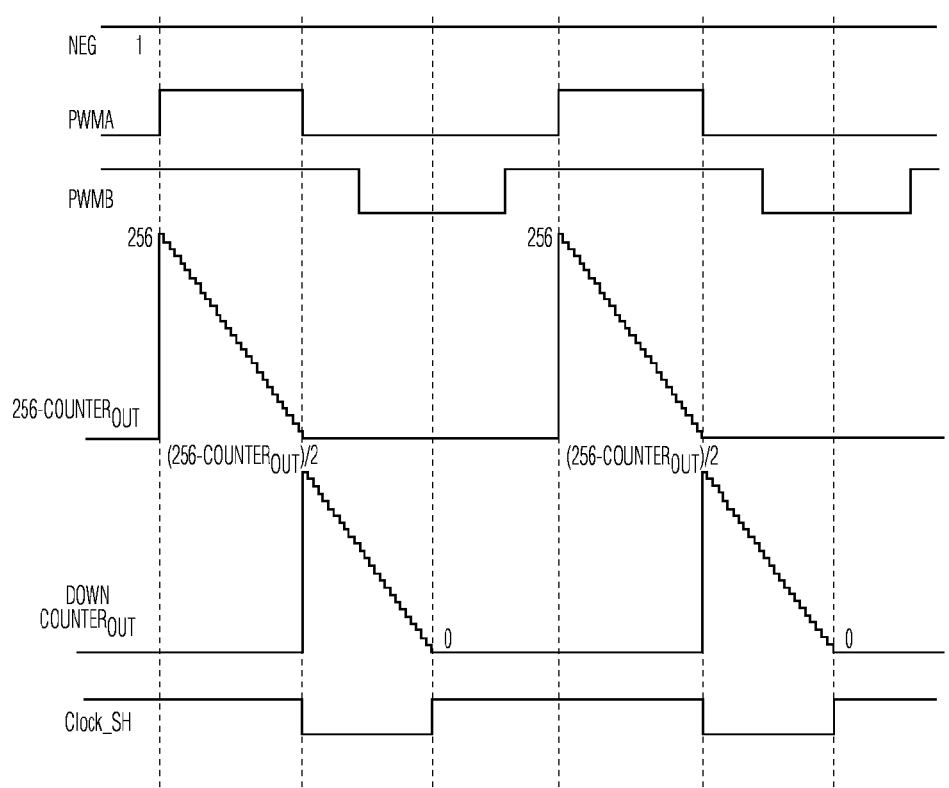
FIG. 12 is a series of plots of signals used and generated by the PWM counter module.

FIG. 12 illustrates a series of exemplary signals resulting from operation of the PWM counter 1100 in FIG. 11, illustrating operation of the various blocks in FIG. 11. The NEG signal indicates whether the input signal is positive or negative. The PWM pulse having the smaller duty-cycle, being PWMA in FIG. 12, is selected to calculate the middle of the period of common switching to ground. At the moment the signal PWMA rises from 0 to 1, the first counter 1101 starts counting down from the number of clock cycles representing the PWM period, in this case 256 cycles. When the PWMA signal falls from 1 to 0, the output from the first counter, which is subtracted by a subtraction block 1102 from the PWM period, triggers a sample and hold block 1103 to provide this subtracted count to a multiplier block 1104, which divides the subtracted count by two. The subtracted and divided count is then used as a starting point for a second counter 1105 to count down from, the second counter 1105 being reset by the falling edge of the PWMA signal. At the same time, the sample and hold clock Clk_SH is triggered to transition to zero, causing switches $S_{A1}$, $S_{A2}$ to close and $S_{A3}$, $S_{A4}$ to open (FIG. 10). When the second counter 1105 reaches zero, the sample and hold clock Clk_SH transitions from zero to 1, causing switches $S_{A1}$, $S_{A2}$ to open and $S_{A3}$, $S_{A4}$ to close, and the voltage across the sampling resistor(s) to be sampled. A sampled voltage is provided to the ADC 406 (FIGS. 4, 5), which provides a digital output representing the current to a digital current limiting module.

As an alternative to the above method, the sampling moment could instead be determined in the analog domain, for example by replacing the counters 1101, 1105 in FIG. 11 with integrators.

Other embodiments are also intended to be within the scope of the invention, as defined by the following claims.

REFERENCES

[1] P. Muggler, W. Chen, C. Jones, P. Dagli, and N. Yazdi, "A filter free class D audio amplifier with 86% power efficiency," in *Proc. Int. Symp. Circuits and Systems*, vol. 1, May 2004, pp. 1-1036-1-1039.

[2] J. Chen, H. Lin, C. Kung, Y. Hwang and J. Su, "Integrated Class-D Amplifier With Active Current Sensing Suitable for Alternating Current Switches", IEEE TRANSACTIONS ON INDUSTRIAL ELECTRONICS, VOL. 55, NO. 8, AUGUST 2008, pp. 3141-3149

[3] A. Bright, "Tracking Changes in Linear Loudspeaker Parameters with Current Feedback", Audio Engineering Society 115th Convention Proceedings, Paper 5909, 10-13 Oct. 2003, New York.

The invention claimed is:

1. A switching amplifier comprising:
an output driving circuit including a pair of switching transistors connected in series between a pair of supply voltage lines;
a switch driver circuit configured to drive the switching transistors with first and second respective PWM signals dependent on an input signal;
an output connection between the pair of transistors for driving an output load; and
an output current sensing circuit for measuring a current through the output load, the output current sensing circuit comprising:
a current sensing resistor connected between a first one of the pair of transistors and an adjacent supply voltage line; and
a voltage sense circuit connected across the current sensing resistor,
wherein the voltage sense circuit is configured to sample a voltage across the current sensing resistor at a midpoint of successive corresponding portions of one of the PWM signals.

2. A switching amplifier comprising:
an output driving circuit including a pair of switching transistors connected in series between a pair of supply voltage lines;
a switch driver circuit configured to drive the switching transistors with first and second respective PWM signals dependent on an input signal;
an output connection between the pair of transistors for driving an output load; and
an output current sensing circuit for measuring a current through the output load, the output current sensing circuit comprising:
a current sensing resistor connected between a first one of the pair of transistors and an adjacent supply voltage line;
a voltage sense circuit connected across the current sensing resistor,
wherein the voltage sense circuit is configured to sample a voltage across the current sensing resistor at a midpoint of successive corresponding portions of one of the PWM signals, and
wherein the voltage sense circuit comprises a PWM counter module and a track and hold circuit, the PWM counter module being configured to count a number of clock cycles of a positive portion of the first PWM signal and to trigger the track and hold circuit to sample the voltage across the current sensing resistor at a midpoint of a subsequent negative portion of the second PWM signal based on a subtraction of a number of clock cycles over a PWM period and the number of clock cycles of a positive portion of the first PWM signal.

3. The amplifier of claim 2 wherein the PWM counter module comprises:
a first counter configured to reset at each rising edge of the first PWM signal and count the number of clock cycles of the positive portion of the first PWM signal;
a subtractor module configured to subtract the number of clock cycles counted by the first counter from the number of clock cycles over the PWM period; and
a second counter configured to reset on each falling edge of the first PWM signal and count for half of a calculated number of clock cycles in a subsequent negative portion of the second PWM signal,
the second counter configured to provide a clock signal to the track and hold circuit to sample the voltage across the sensing resistor when half the number of clock cycles in the subsequent negative portion of the second PWM signal are counted.

4. The amplifier of claim 3 wherein the PWM counter module further comprises a multiplier module configured to receive the number of clock cycles of the negative portion of the second PWM signal from the subtraction module and provide half the number of clock cycles in the negative portion of the second PWM signal to the second counter.

5. The amplifier of claim 3 wherein the second counter is configured to count the number of clock cycles in the subsequent negative portion of the second PWM signal at twice a rate of the first counter.

6. A switching amplifier comprising:
an output driving circuit including a pair of switching transistors connected in series between a pair of supply voltage lines;
a switch driver circuit configured to drive the switching transistors with first and second respective PWM signals dependent on an input signal;
an output connection between the pair of transistors for driving an output load; and
an output current sensing circuit for measuring a current through the output load, the output current sensing circuit comprising:
a current sensing resistor connected between a first one of the pair of transistors and an adjacent supply voltage line
;
a voltage sense circuit connected across the current sensing resistor,
wherein the voltage sense circuit is configured to sample a voltage across the current sensing resistor at a midpoint of successive corresponding portions of one of the PWM signals, and
wherein the output driving circuit comprises a first pair and a second pair of switching transistors, each pair of switching transistors connected in series between the pair of supply voltage lines.

7. The amplifier of claim 6 wherein the pair of supply voltage lines are a voltage supply line and a ground line, the current sensing resistor connected between a first one of the first pair of switching transistors and the ground line.

8. The amplifier of claim 6 wherein the first one of each pair of switching transistors is an N-MOS transistor.

9. The amplifier of claim 7, further comprising a second current sensing resistor connected between a first one of the second pair of switching transistors and the ground line.

10. The amplifier of claim 9 wherein the voltage sense circuit is configured to sample a differential voltage across the first and second current sensing resistors.

11. A method of sensing output current from a switching amplifier having an output driving circuit including a pair of switching transistors connected in series between a pair of supply voltage lines, the pair of switching transistors being driven by a switch driver circuit with first and second respective PWM signals dependent on an input signal, the method comprising: triggering a track and hold circuit to sample a voltage across a current sensing resistor connected between a first one of the pair of transistors and an adjacent supply voltage line at a midpoint of the subsequent negative portion of the second PWM signal.

12. A method of sensing output current from a switching amplifier having an output driving circuit including a pair of switching transistors connected in series between a pair of supply voltage lines, the pair of switching transistors being driven by a switch driver circuit with first and second respective PWM signals dependent on an input signal, the method comprising:

triggering a track and hold circuit to sample a voltage across a current sensing resistor connected between a first one of the pair of transistors and an adjacent supply voltage line at a midpoint of the subsequent negative portion of the second PWM signal;

counting a number of clock cycles of a positive portion of the first PWM signal;

calculating a number of clock cycles in a subsequent negative portion of the second PWM signal by subtracting the number of clock cycles of the positive portion from a number of clock cycles in a period of the PWM signals; and calculating a midpoint of the subsequent negative portion of the second PWM signal by halving the calculated number of clock cycles in the negative portion of the second PWM signal.

* * * * *